United States Patent
Zainuddin et al.

(10) Patent No.: US 10,755,982 B1
(45) Date of Patent: Aug. 25, 2020

(54) METHODS OF FORMING GATE STRUCTURES FOR TRANSISTOR DEVICES ON AN IC PRODUCT

(71) Applicant: GLOBALFOUNDRIES Inc., Grand Cayman (KY)

(72) Inventors: Abu Naser M. Zainuddin, Clifton Park, NY (US); Wei Ma, Clifton Park, NY (US); Daniel Jaeger, Saratoga Springs, NY (US); Joseph Versaggi, Galway, NY (US); Jae Gon Lee, Waterford, NY (US); Thomas Kauerauf, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/508,816

(22) Filed: Jul. 11, 2019

(51) Int. Cl.
  *H01L 21/8234*  (2006.01)
  *H01L 27/088*  (2006.01)
  *H01L 29/66*  (2006.01)

(52) U.S. Cl.
  CPC ........ *H01L 21/823437* (2013.01); *H01L 21/823431* (2013.01); *H01L 27/0886* (2013.01); *H01L 29/66795* (2013.01)

(58) Field of Classification Search
  CPC ..... H01L 21/823437; H01L 21/823431; H01L 29/66795; H01L 27/0886; H01L 29/78696; H01L 21/823807; H01L 21/823842
  See application file for complete search history.

(56) References Cited

U.S. PATENT DOCUMENTS

| | | | |
|---|---|---|---|
| 8,941,177 B2 | 1/2015 | Adams et al. | |
| 9,972,642 B2 | 5/2018 | Hafez et al. | |
| 10,106,892 B1 | 10/2018 | Siddiqui et al. | |
| 10,332,809 B1* | 6/2019 | Ando | H01L 27/092 |
| 2012/0094475 A1* | 4/2012 | Tsau | H01L 29/66545 438/589 |
| 2015/0061041 A1* | 3/2015 | Lin | H01L 29/66545 257/410 |
| 2019/0157269 A1* | 5/2019 | Koh | H01L 21/28525 |
| 2019/0363026 A1* | 11/2019 | Lee | H01L 21/82388 |
| 2020/0058560 A1* | 2/2020 | Chen | H01L 29/785 |

* cited by examiner

*Primary Examiner* — Ahmed N Sefer
(74) *Attorney, Agent, or Firm* — Amerson Law Firm, PLLC (57) ABSTRACT

One illustrative method disclosed herein includes forming 1st and 2nd sacrificial gate structures for, respectively, 1st and 2nd devices, removing 1st and 2nd sacrificial gate electrodes from the 1st and 2nd sacrificial gate structures so as to at least partially define, respectively, 1st and 2nd replacement gate (RMG) cavities, and removing the 2nd sacrificial gate insulation layer from the 2nd RMG cavity while leaving the 1st sacrificial gate insulation layer in position in the 1st RMG cavity. The method also includes forming a conformal gate insulation layer in both the 1st and 2nd RMG cavities, removing the conformal gate insulation layer and the 1st sacrificial gate insulation layer from the 1st RMG cavity while leaving the conformal gate insulation layer in the 2nd RMG cavity, and performing an oxidation process to form an interfacial gate insulation layer only in the 1st RMG cavity.

19 Claims, 10 Drawing Sheets

METHODS OF FORMING GATE STRUCTURES FOR TRANSISTOR DEVICES ON AN IC PRODUCT

BACKGROUND

Field of the Invention

The present disclosure generally relates to the fabrication of integrated circuits, and, more particularly, to various novel methods of forming gate structures for transistor devices on an integrated circuit (IC) product.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NFET or PFET type devices wherein the "N" and "P" designation is based upon the nature of the charge carriers (electrons for NFET devices, holes for PFET devices) and type (N or P) of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

In many integrated circuit (IC) products, transistor devices are formed with different channel lengths (critical dimension) and with different threshold voltages (Vt) such that the resulting devices exhibit different characteristics that permit product designers to produce integrated circuits that perform in a certain desired manner. For example, in some applications, integrated circuits are designed with devices having different channel lengths. In general, all other things being equal, a transistor device with a relatively shorter channel length will have a threshold voltage that is less than the threshold voltage of a transistor device that has a relatively longer channel length. Conversely, all other things being equal, the off-state leakage current of a transistor device with a relatively shorter channel length is typically greater than the off-state leakage current of a transistor device having a relatively longer channel length. Transistor devices with a relatively shorter channel length may be employed in portions of an integrated circuit where fast switching speeds of the transistors is very important, e.g., the logic or computational circuits in an integrated circuit product, a section of the IC product where the switching speed of the transistors is more important than controlling the off-state leakage current of such transistors. In contrast, transistor devices with a relatively longer channel length may be employed as circuit element in circuits where the switching speed of the transistors is less important than their ability to exhibit low off-state leakage currents. For example, such longer channel length devices may be employed in input/output circuits so as to reduce power consumption when the IC product is turned off. In some applications, IC products are designed such that there is an intentional mismatch in the threshold voltages ("$V_t$ mismatch") of the transistor devices with a relatively shorter channel length and the transistor devices having a relatively longer channel length that are formed on the product so as to permit the devices to be independently turned on and off.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate structures for transistor devices on an IC product. One illustrative method disclosed herein includes, among other things, forming first and second sacrificial gate structures for, respectively, first and second transistor devices, removing first and second sacrificial gate electrodes from the first and second sacrificial gate structures so as to at least partially define, respectively, first and second replacement gate (RMG) cavities for, respectively, the first and second transistor devices, and removing a second sacrificial gate insulation layer from the second RMG cavity while leaving a first sacrificial gate insulation layer in position in the first RMG cavity. In this example, the method also includes forming a conformal gate insulation layer in both the first and second RMG cavities, performing at least one process operation to remove the conformal gate insulation layer and the first sacrificial gate insulation layer from the first RMG cavity while leaving the conformal gate insulation layer in position in the second RMG cavity, and performing an oxidation process to form an interfacial gate insulation layer only in the first RMG cavity.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-10 depict various novel methods of forming gate structures for first and second transistor devices 101A, 101B (collectively referenced using the numeral 101). In the examples depicted herein, the transistor devices 101 are illustrative FINFET devices. However, as will be appreciated by those skilled in the art after a complete reading of the present application, the methods disclosed herein may be employed when forming other types of transistor devices, e.g., planar transistor devices. Of course, the transistors 101 may be either NFET or PFET devices. In one illustrative embodiment, the transistors 101 may have different gate (or channel) lengths, but that may not be the case in all applications. For example, in one illustrative embodiment that is based upon current-day technology, the first transistor 101A may have a channel length of about 18 nm (or less) and the second transistor 101B may have a channel length that falls in the range of about 18-30 nm. Of course, as will be appreciated by those skilled in the art, the above dimensions are provided by way of example only.

Figure 1:
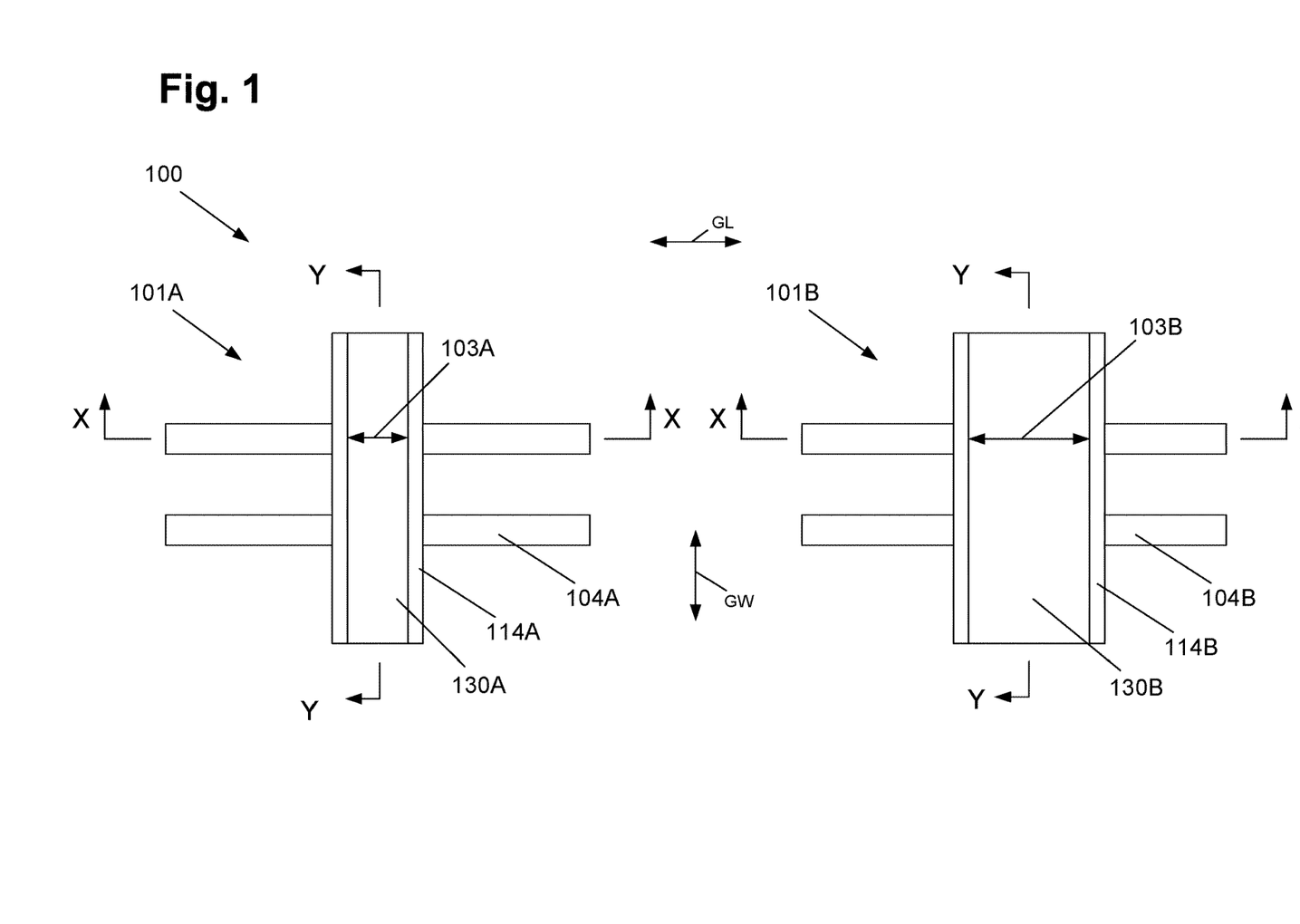
FIGS. 1-10 depict various novel methods of forming gate structures for transistor devices on an IC product.

FIG. 1 is a simplistic plan view of an illustrative IC product 100 that includes an illustrative embodiment of the first transistor 101A and an illustrative embodiment of the second transistor 101B (collectively referred to by use of the reference numeral 101) and also depicts where various cross-sectional views in the following drawings are taken. In the example depicted herein, the transistor devices 101 are each comprised of two illustrative fins 104A, 104B, respectively. Of course, the transistor devices 101 may have any desired number of fins and the number of fins on each of the devices need not be the same, although that may the case in some applications. Of course, as noted above, the methods disclosed herein may be used to form other types of transistor devices 101, e.g., planar devices. The gate length (GL) and gate width (GW) directions of the transistor devices 101 are also depicted in at least some of the drawings.

Figure 2:
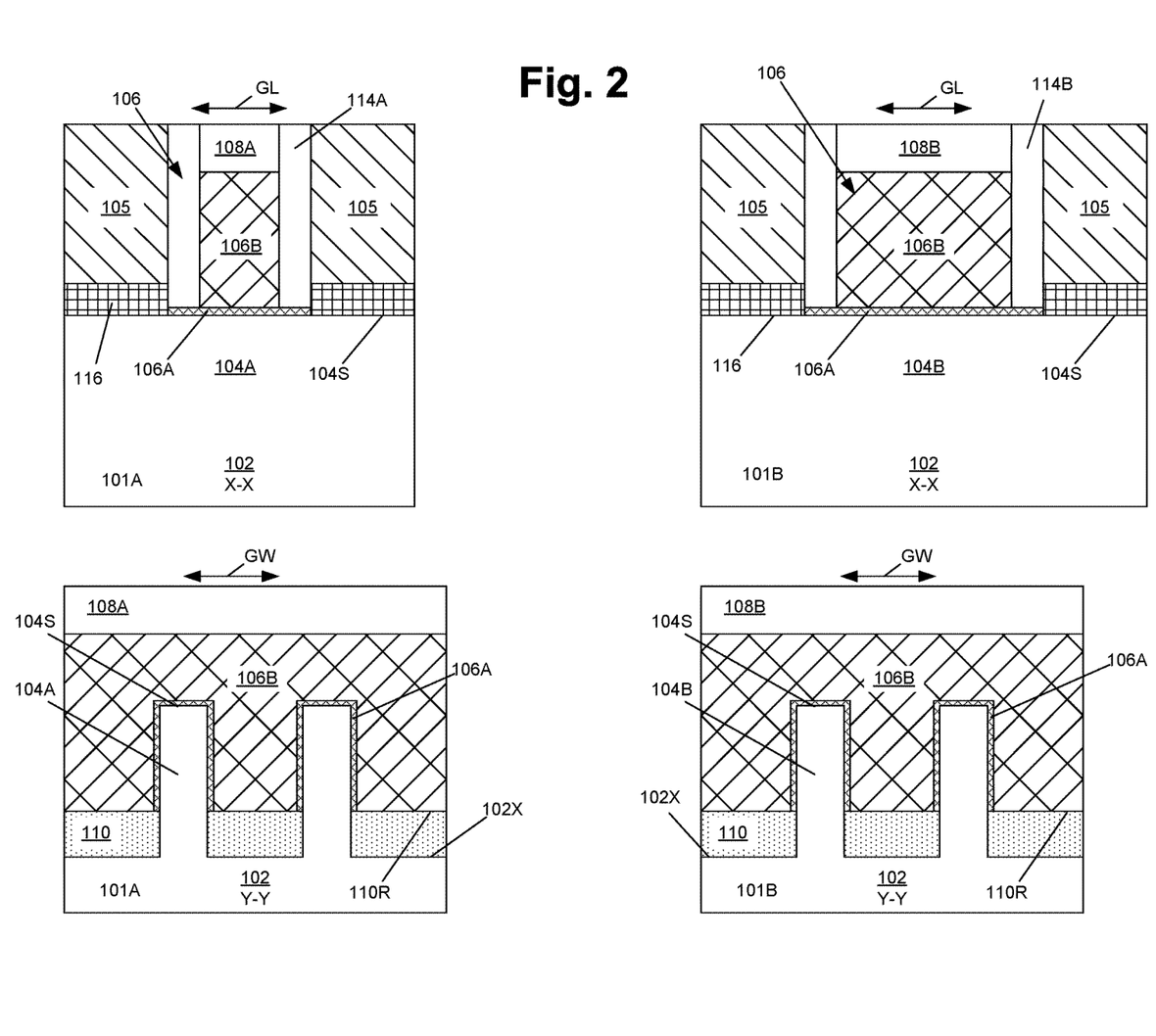

As shown in FIGS. 1 and 2, the transistor devices 101A, 101B comprise a gate cap (130A, 130B, respectively) that is positioned over a gate structure (not shown in FIG. 1) and at least one illustrative sidewall spacer (114A, 114B) that is positioned adjacent the gate structure of each device 101. The transistor devices 101 may be formed in spaced-apart areas of a semiconductor substrate 102 or they may be formed laterally adjacent one another on the substrate 102. The first transistor 101A has a gate length (critical dimension) 103A (as measured at mid-point of the fin 104A) while the second transistor 101B has a gate length 103B. As noted above, in one illustrative embodiment, the gate length 103A of the first transistor device 101A may be less than a gate length 103B of the second transistor device 101B, but that may not be the case in all applications. In the following drawings, the cross-sectional view X-X is taken through an illustrative fin (in the gate-length direction of the transistor devices 101). The cross-sectional view Y-Y is taken through the gate structure of the transistor devices 101 in a direction that corresponds to the gate-width direction of the transistor devices 101. The first transistor device 101A is shown on the left side of the drawings while the second transistor device 101B is shown on the right side of the drawings.

The illustrative transistor devices 101 will be formed in and above a semiconductor substrate 102. As noted above, the transistor devices 101 depicted herein may be either NFET or PFET transistors. In the example depicted herein, the gate structures of the transistor devices 101 will be formed using replacement gate processing techniques. Additionally, various doped regions, e.g., halo implant regions, doped source/drain regions, well regions and the like, on the transistor devices 101 are not depicted in the attached drawings. The substrate 102 may have a variety of configurations, such as the depicted bulk silicon configuration. The substrate 102 may also have a semiconductor-on-insulator (SOI) configuration that includes a base semiconductor layer, a buried insulation layer and an active layer positioned above the buried insulation layer, wherein the transistor devices 101 are formed in and above the active layer. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2 depicts the transistor devices 101 after several process operations were performed. First, one or more etching processes, e.g., anisotropic etching processes, were performed through a patterned fin-formation etch mask (not shown) to form a plurality of fin-formation trenches 102X and thereby define a plurality of fins 104A, 104B (collectively referred to by use of the reference numeral 104) across the substrate 102. The patterned fin-formation hard mask may be comprised of one or more layer of materials and it may be formed to any desired overall thickness. As one example, the patterned fin-formation hard mask may be comprised of a relatively thin layer of silicon dioxide and a relatively thicker layer of silicon nitride.

With continuing reference to FIG. 2, at this point in the process flow, all of the fins 104 are substantially the same in terms of their physical size, i.e., the lateral width and vertical height of the fins 104. Of course, the lateral width and vertical height of the fins 104 may vary depending upon the particular application. Additionally, the overall size, shape and configuration of the fin-formation trenches 102X and the fins 104 may vary depending on the particular application. In the illustrative examples depicted in the attached drawings, the fin-formation trenches 102X and the fins 104 are all depicted as having a uniform size and shape. However, such uniformity in the size and shape of the trenches 102X and the fins 104 is not required to practice at least some aspects of the inventions disclosed herein. In the attached figures, the fin-formation trenches 102X are depicted as having been formed by performing an anisotropic etching process that results in the fins 104 having a schematically (and simplistically) depicted, generally rectangular cross-sectional configuration (see view Y-Y). In an actual real-world transistor device, the sidewalls of the fins 104 may be somewhat outwardly tapered (i.e., the fins may be wider at the bottom of the fin than they are at the top of the fin) although that configuration is not depicted in the attached drawings. Thus, the size and configuration of the fin-formation trenches 102X and the fins 104, and the manner in which they are made, should not be considered a limitation of the present invention. For ease of disclosure, only the substantially rectangular trenches 102X and fins 104 will be depicted in the subsequent drawings.

With continuing reference to FIG. 2, after formation of the fins 104, a layer of insulating material 110 (e.g., silicon dioxide) was deposited so as to overfill the fin-formation trenches 102X. Thereafter, at least one process operation, such as a chemical mechanical polishing (CMP) process, was performed to planarize the upper surface of the layer of insulating material 110. Thereafter, a recess etching process was performed on the layer of insulating material 110 to reduce its thickness within the fin-formation trenches 102X such that it has a recessed upper surface 110R that is positioned at a level that is below the level of the upper surface 104S of the fins 104.

Next, sacrificial gate structures 106 (comprised of a sacrificial gate insulation layer 106A and a sacrificial gate electrode 106B) and initial gate caps 108A, 108B (collectively referred to by use of the reference numeral 108) were formed for each of the transistor devices 101. In one illustrative example, the sacrificial gate insulation layer 106A may be formed by performing an oxidation process so as to oxidize the exposed portions of the fins 104 above the recessed upper surface 110R of the layer of insulating material 110. In one illustrative example, the sacrificial gate insulation layer 106A may have a thickness of about 3-4 nm. At that point, the material for the sacrificial gate electrode 106B, e.g., amorphous silicon, polysilicon, etc., was blanket-deposited across the substrate 102 and its upper surface was subjected to a CMP process to planarize the upper surface of the deposited layer of sacrificial gate electrode material. Thereafter, the material for the gate caps 108, e.g., silicon nitride, was blanket-deposited across the substrate 102 above the layer of material for the sacrificial gate electrode 106B. Next, a patterned etch mask layer (not shown) was formed above the layer of gate cap material. Then, an etching process was performed through the patterned etch mask so as to pattern the layer of gate cap material, thereby resulting in the gate caps 108A, 108B depicted in FIG. 2. Thereafter, the patterned etch mask was removed and another etching process was performed through the patterned gate caps 108 to remove the exposed portions of the sacrificial gate electrode material layer so as to result in the patterned sacrificial gate electrode structures 106B depicted in FIG. 2. As indicated, at this point in the process, the sacrificial gate insulation layer 106A remains positioned on the fins 104 in the channel region and source/drain regions of the transistor devices 101.

With continuing reference to FIG. 2, simplistically depicted sidewall spacers 114A, 114B (collectively referred to by use of the reference numeral 114) were formed around and adjacent the entire perimeter of the sacrificial gate structures 106 on the devices 101A, 101B, respectively. Although only a single sidewall spacer 114 is depicted in the drawings for each device 101, in practice, more than one sidewall spacer may be formed adjacent the sacrificial gate structures 106 of the devices 101. The sidewall spacers 114 may be formed by depositing a conformal layer of spacer material (not shown) above the substrate 102 and thereafter performing an anisotropic etching process to remove horizontally positioned portions of the layer of spacer material. The spacers 114 may be of any desired thickness (as measured at their base) and they may be comprised of a variety of different materials, e.g., silicon dioxide, a low-k material, silicon nitride, SiCN, SiN, SiCO, and SiOCN, etc. After the spacers 114 were formed, an etching process was performed to remove the exposed portions of the sacrificial gate insulation layer 106A in the source/drain regions of the transistor devices 101.

Then, an epi semiconductor material 116 was formed on the exposed portions of the fins 104 in the source/drain regions of the transistor devices 101 by performing an epitaxial growth process. The epi material 116 may be formed to any desired thickness. However, it should be understood that the epi material 116 need not be formed in all applications. Next, a layer of insulating material 105 was blanket-deposited on the device 100 so as to overfill the areas above the epi material 116 in the source/drain regions of the transistor devices 101. At that point, a CMP process was performed to planarize the layer of insulating material 105 using the gate caps 108 as a polish-stop layer. The layer of insulating material 105 may be made from a variety of insulating materials, e.g., silicon dioxide, SiCO, a low-k material (k value of 8 or less), etc. The layer of material 105 is intended to be representative in nature in that multiple layers of insulating material may be formed in lieu of the single layer of material 105 depicted in the drawings.

Figure 3:
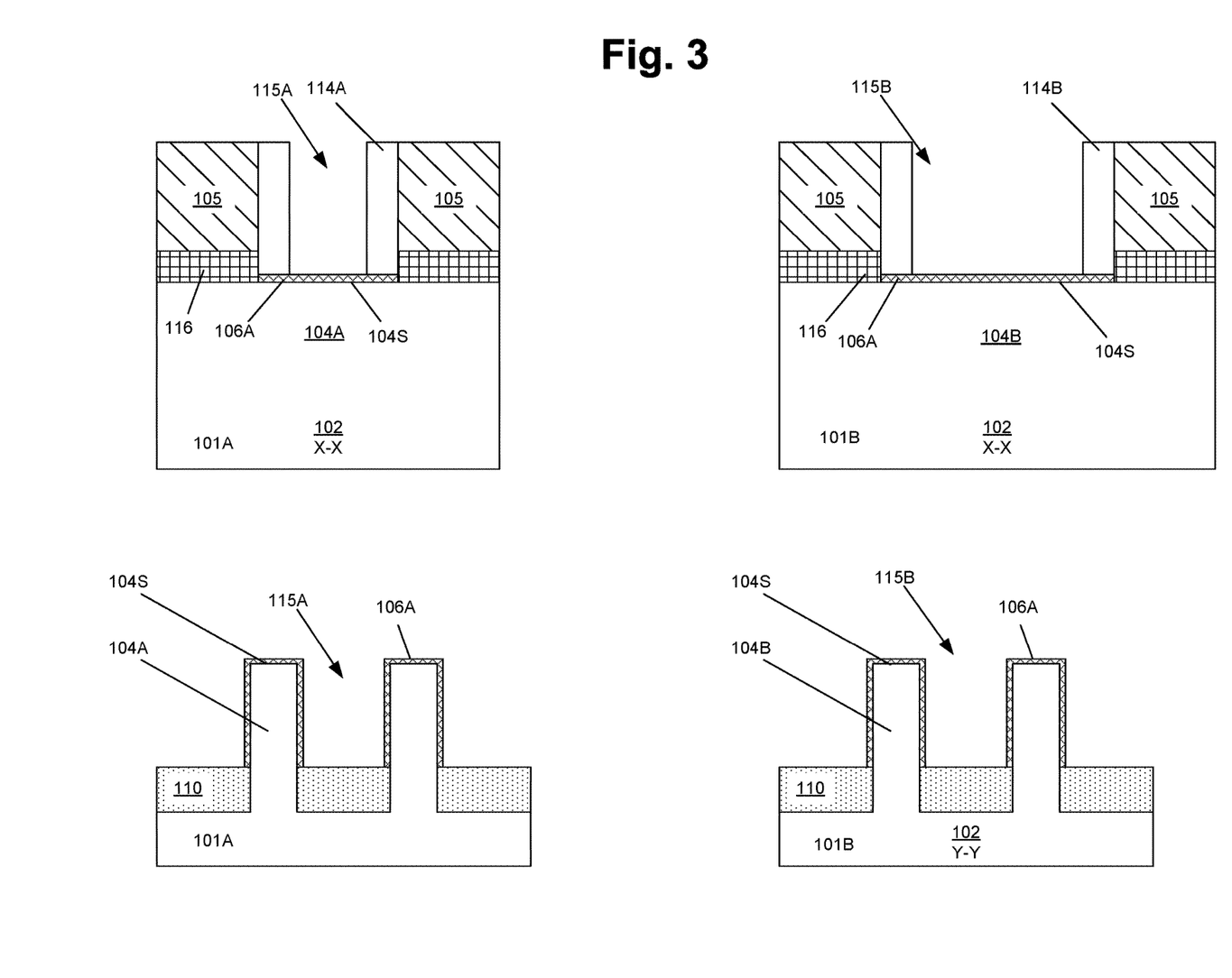

FIG. 3 depicts the transistor devices 101 after several process operations were performed. First, a CMP process was performed to remove the gate caps 108 on the devices 101 and thereby expose the sacrificial gate electrode structures 106B on the devices 101. Then, one or more etching processes were performed to remove the sacrificial gate electrode structures 106B so as to thereby expose the sacrificial gate insulation layers 106A for both of the devices 101. These process operations result in the formation of replacement gate (RMG) cavities 115A, 115B (collectively referred to by use of the reference numeral 115) on the devices 101A, 101B, respectively.

Figure 4:
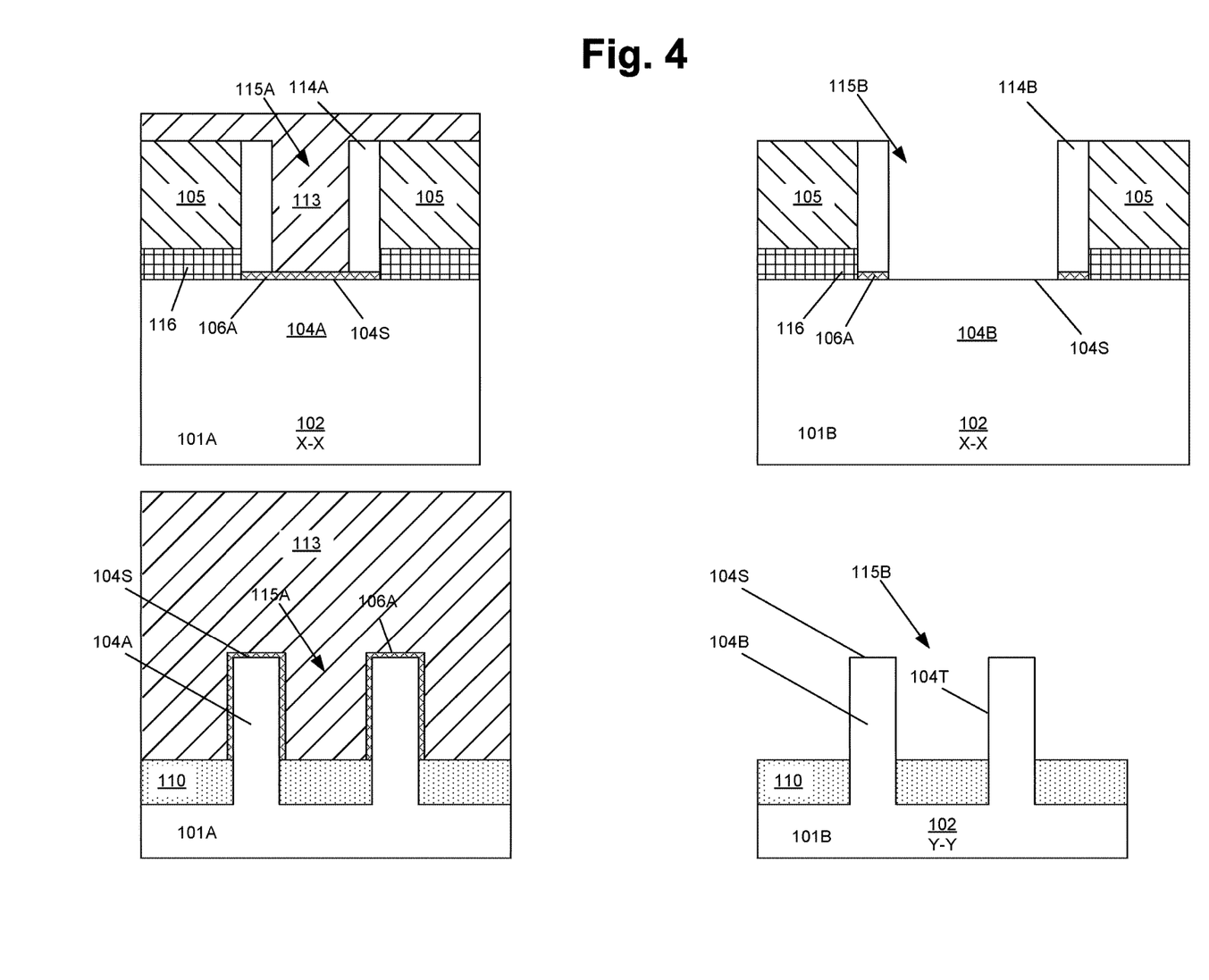

FIG. 4 depicts the product 100 after several process operations were performed. First a patterned etch mask layer 113 (e.g., photoresist or OPL) was formed above the substrate 102. The patterned etch mask 113 covers the first transistor device 101A but leaves the second transistor device 101B exposed for further processing. Thereafter, an etching process was performed to remove the sacrificial gate insulation layer 106A from within the RMG cavity 115B on the second transistor device 101B. This process operation exposes the upper 104S and side 104T surfaces of the portion of the fins 104B with the RMG cavity 115B on the second transistor device 101B.

Figure 5:
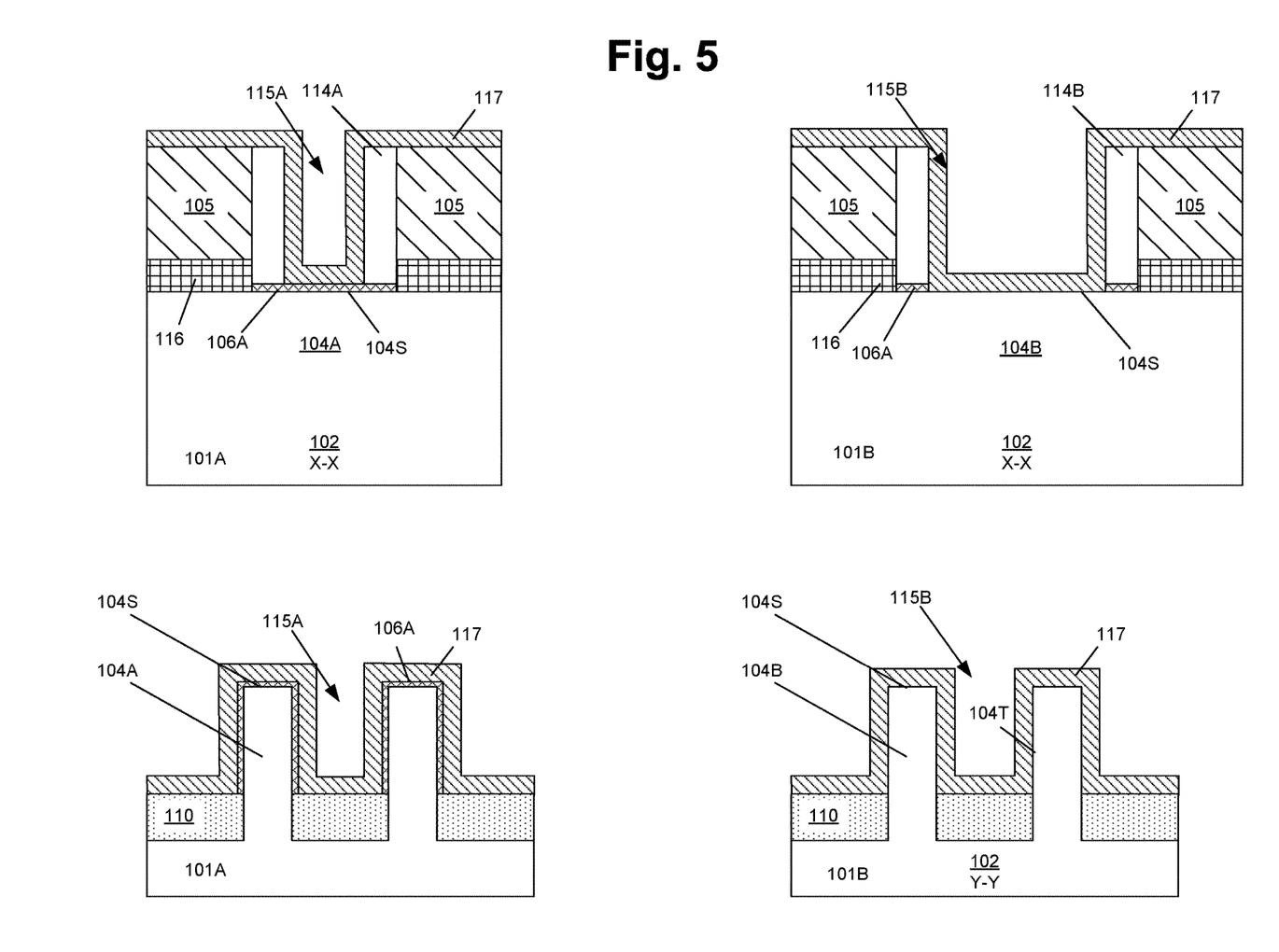

FIG. 5 depicts the product 100 after several process operations were performed. First, the patterned etch mask layer 113 was removed. Thereafter, a conformal gate insulation layer 117 was formed on the devices 101 by performing a conformal deposition process, e.g., a conformal ALD deposition process. The conformal gate insulation layer 117 may be comprised of a variety of different materials and its thickness may vary depending upon the particular application. In one illustrative example, the conformal gate insulation layer 117 may be comprised of silicon dioxide, a high-k material, (k greater than 10), etc., and it may have a thickness of about 3-4 nm.

Figure 6:
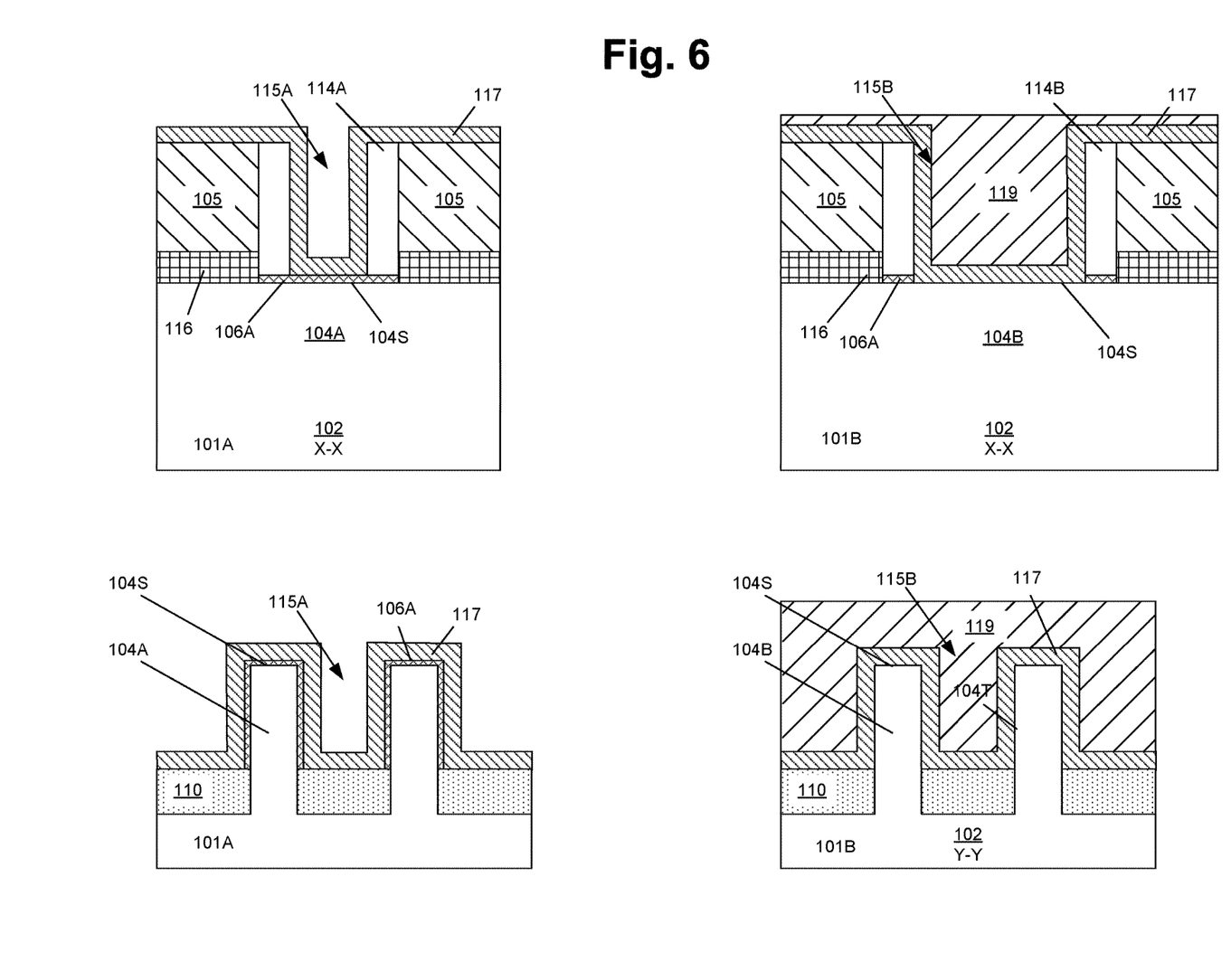

FIG. 6 depicts the product 100 after another patterned etch mask layer 119 (e.g., photoresist or OPL) was formed above the substrate 102. The patterned etch mask 119 covers the second transistor device 101B but leaves the first transistor device 101A exposed for further processing.

Figure 7:
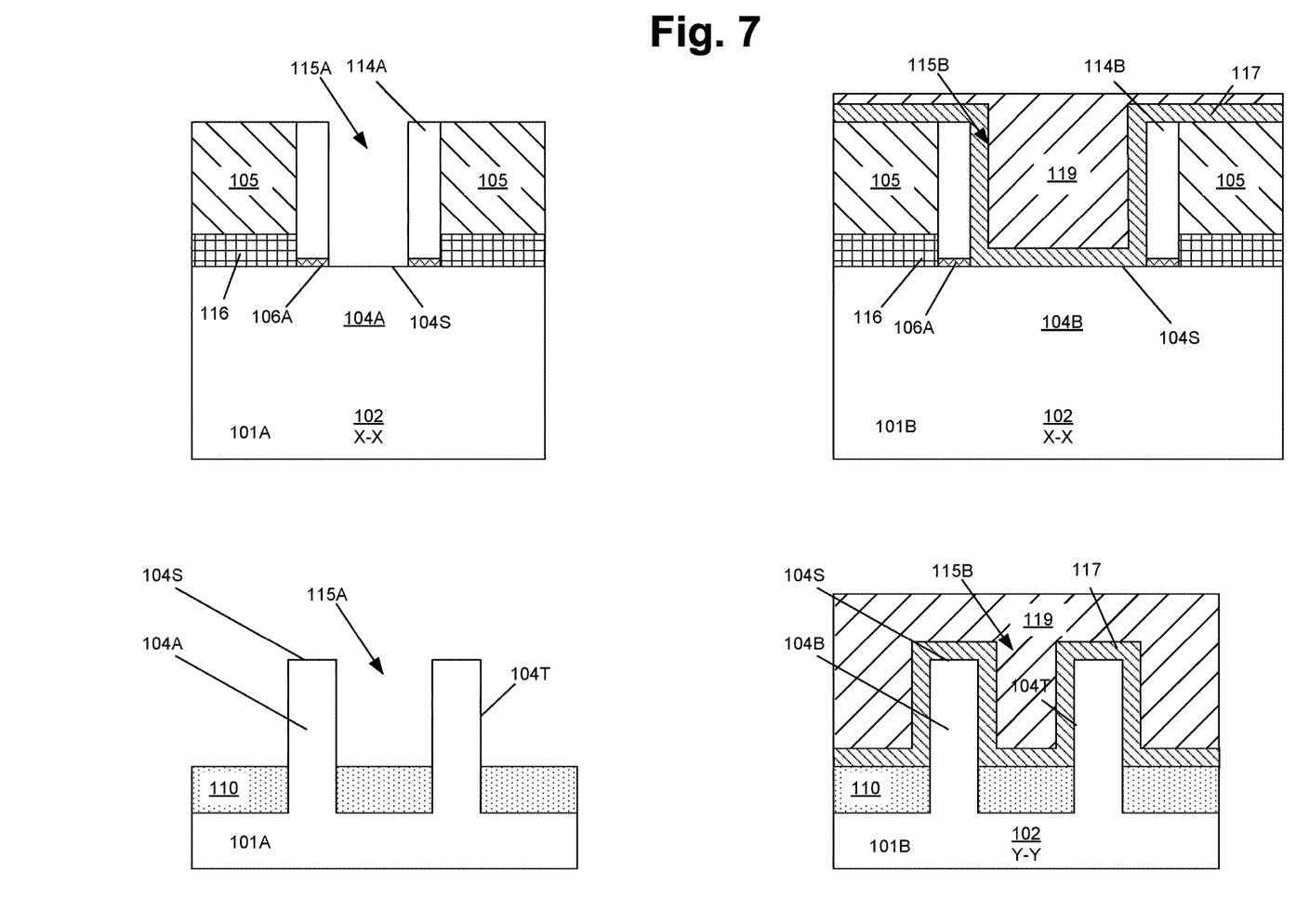

FIG. 7 depicts the IC product after one or more etching processes were performed to remove the conformal gate insulation layer 117 from the first transistor device 101A and to remove the sacrificial gate insulation layer 106A from within the RMG cavity 115A on the first transistor device 101A. These process operations expose the upper 104S and side 104T surfaces of the portion of the fins 104A with the RMG cavity 115A on the first transistor device 101A.

Figure 8:
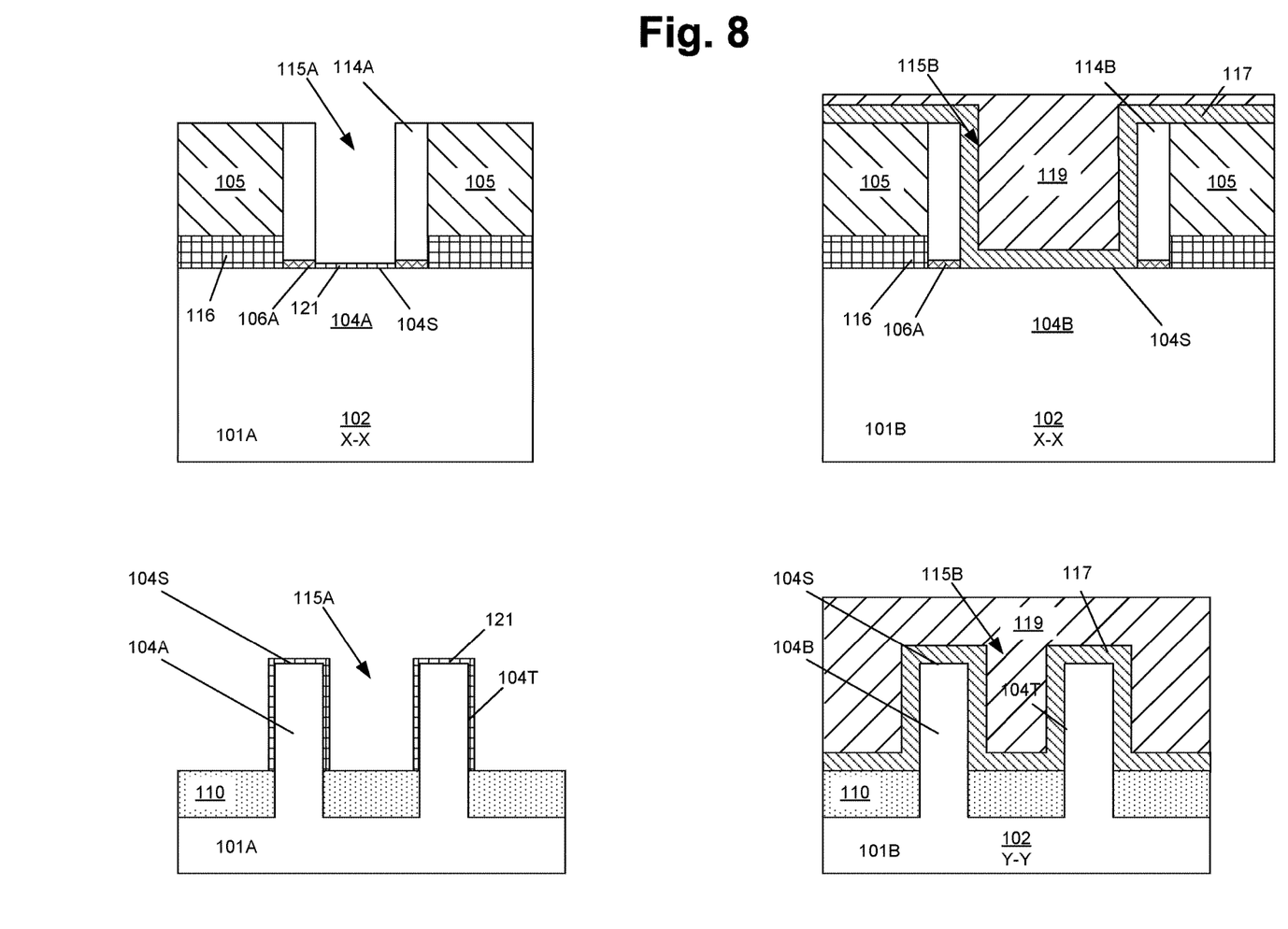

FIG. 8 depicts the product 100 after an oxidation process is performed to grow an interfacial gate insulation layer 121 on the upper 104S and side 104T surfaces of the portion of the fins 104A with the RMG cavity 115A on the first transistor device 101A. The interfacial gate insulation layer 121 may be comprised of a variety of different materials and its thickness may vary depending upon the particular application. In one illustrative example, the interfacial gate insulation layer 121 may be comprised of silicon dioxide, SiON, etc., and it may have a thickness of less than about 1 nm. The thickness of the interfacial gate insulation layer 121 may be substantially equal to, less than or greater than the thickness of the sacrificial gate insulation layer 106A.

Figure 9:
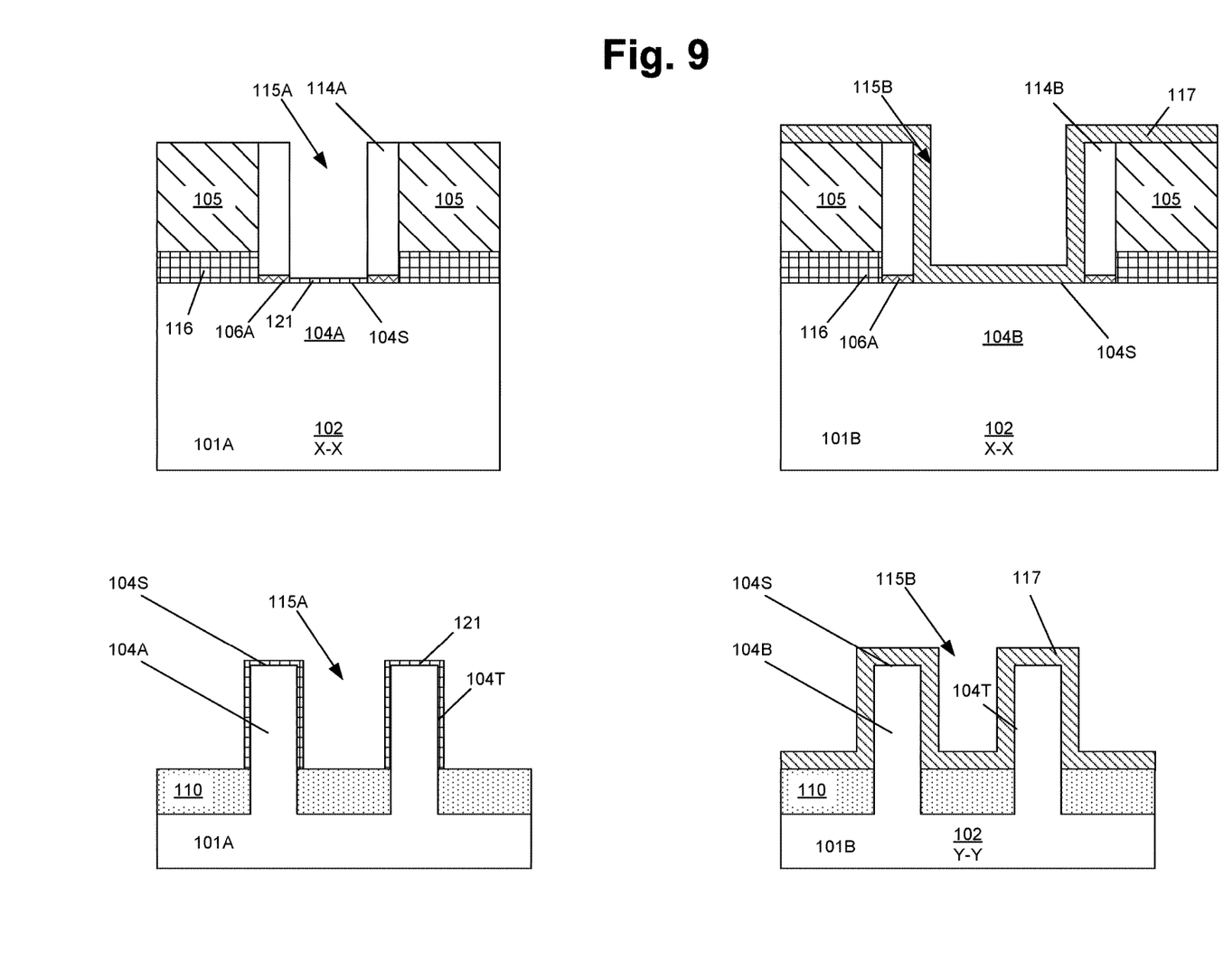

FIG. 9 depicts the product 100 after the patterned etch mask layer 119 (e.g., photoresist or OPL) was removed from the substrate 102. As depicted, the conformal gate insulation layer 117 is only present in the RMG cavity 115B of the second transistor device 101B. At this point, the only gate insulation material in the RMG cavity 115A of the first transistor device 101A is the interfacial gate insulation layer 121. The presence of this interfacial gate insulation layer 121 is useful during the formation of a high-k gate insulation layer that will subsequently be formed, and it may provide additional benefits in terms of device performance and reliability. At the point of processing shown in FIG. 9, known replacement gate manufacturing processing may be performed to form final gate structures.

Figure 10:
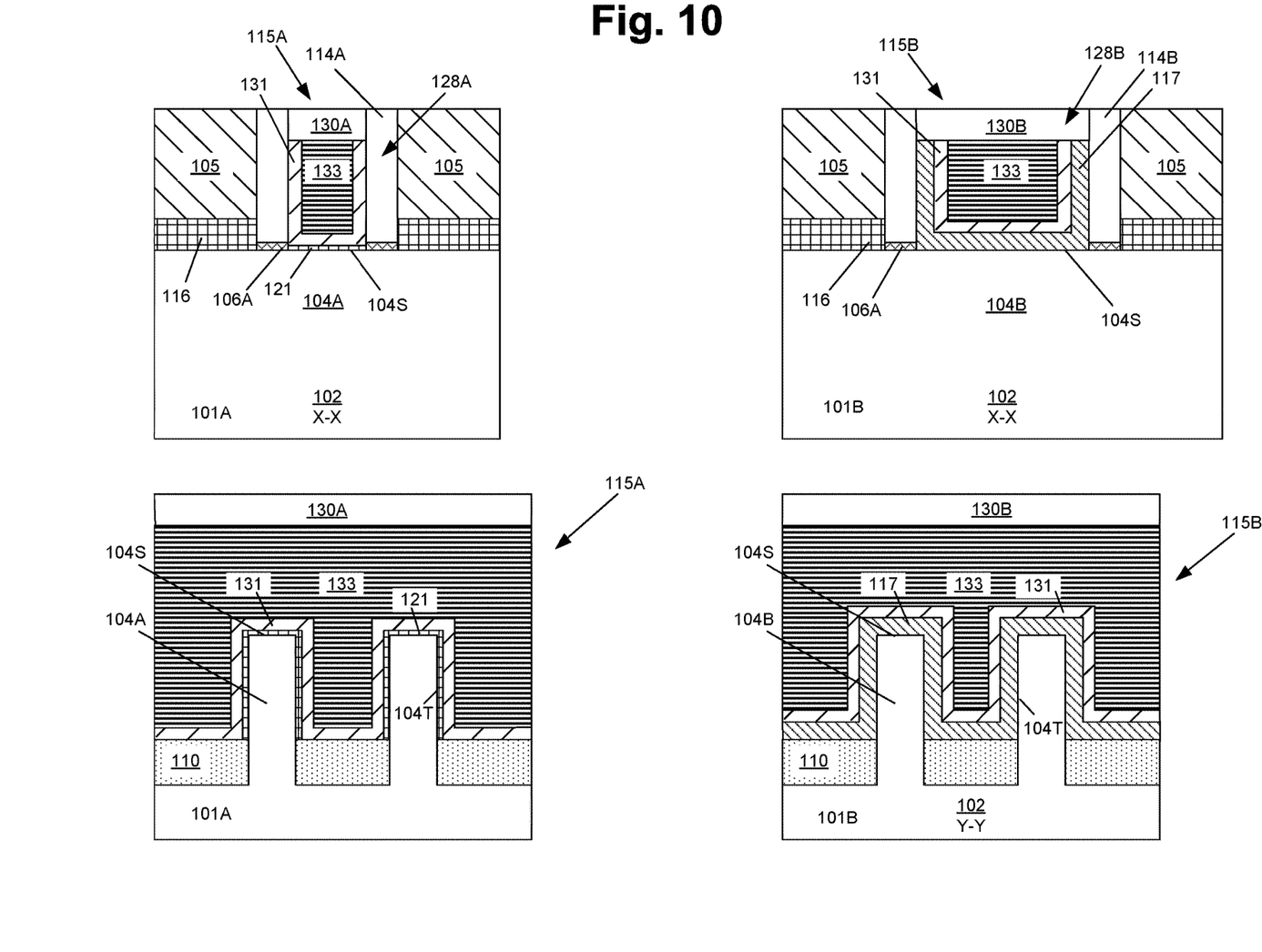

Accordingly, FIG. 10 depicts the product after simplistically depicted replacement (final) gate structures 128A, 128B (collectively referred to by use of the reference numeral 128) and final gate caps 130A, 130B (collectively referred to by use of the reference numeral 130) were formed in the RMG cavities 115A, 115B for the devices 101A, 101B, respectively, using well-known manufacturing techniques.

The interfacial gate insulation layer 121 will be part of the gate structure 128A for the first transistor device 101A, but the conformal gate insulation layer 117 will not be present in the gate structure 128A for the first transistor device 101A. Conversely, the conformal gate insulation layer 117 will be part of the gate structure 128B for the second transistor device 101B, but the interfacial gate insulation layer 121 will not be present in the gate structure 128B for the second transistor device 101B. If both of the transistor devices are the same type, the other materials that constitute the replacement gate structures 128A, 128B may not be the same materials, although that may be the case in some applications. Of course, if the transistor devices 101 are opposite type devices, the materials of construction may be different for NFET and PFET devices. In some cases, even if the devices 101 are opposite type devices, they may have some materials in common. For example, a high-k gate insulation layer in the gate structures 128 may be made of the same material and formed at the same time.

With continued reference to FIG. 10, typically, the materials for the replacement gate structures 128 are sequentially formed in the RMG cavities 115. For example, a first conformal deposition process may be performed to form a high-k gate insulation layer 131 in the RMG cavities 115 followed by performing a second conformal deposition process to form a work function adjusting metal layer (not separately shown) such as, e.g., titanium nitride, TiC, TiAlC, W, Al, etc. (depending upon the type of device (N or P) being manufactured), on the gate insulation layer 131 in the RMG cavities 115. Thereafter, a blanket deposition process may be performed to form a bulk conductive material 133 (e.g., tungsten, aluminum, polysilicon, etc.) on the conformal work function adjusting metal layer so as to over-fill the remaining portion of the RMG cavities 115. Thereafter, one or more CMP processes were performed so as to remove excess portions of the conformal gate insulation layer 117 and the various materials of the gate structures 128 that are positioned above the upper surface of the layer of insulating material 105 and outside of the RMG cavities 115. At that point, one or more recess etching processes were performed to recess the vertical height of the materials of the replacement gate structures 128 so as to make room for the gate caps 130. The gate caps 130 may be formed by blanket depositing a layer of the material for the gate caps 130 above the devices and in the space above the recessed gate materials for the gate structures 128. At that point, another CMP process may be performed using the layer of insulating material 105 as a polish-stop so as to remove excess amounts of the material for the gate caps 130. At this point in the processing, the final replacement gate structures 128 with final gate caps 130 for the devices have been formed. Of course, as noted above, the materials of construction for the replacement gate structures 128 may vary depending upon whether the device 100 is an N-type device or a P-type device. Additionally, the replacement gate structures 128 may have a different number of layers of material depending upon the type of device under construction, e.g., the replacement gate structure 128 for an N-type device may comprise more layers of conductive material than are present in a replacement gate structure 128 for a P-type device. The gate insulation layer 131 may be comprised of a variety of different materials, such as, for example, silicon dioxide, a so-called high-k (k greater than 10) insulation material (where k is the relative dielectric constant), etc. The gate caps 130 may be made of a variety of different materials, e.g., silicon nitride, SiCN, SiN/SiCN, SiOC, SiOCN, etc.

As will be appreciated by those skilled in the art after a complete reading of the present application, there are several novel methods disclosed herein for forming replacement gate structures on transistor devices 101. One illustrative method of forming first and second replacement gate structures 128A, 128B for, respectively, first and second transistor devices 101A, 101B comprises forming first and second sacrificial gate structures 106 for, respectively, the first and second transistor devices, wherein the first and second sacrificial gate structures 106 comprise, respectively, first and second sacrificial gate insulation layers 106A and, respectively, first and second a sacrificial gate electrodes 106B. The method also includes removing the first and second sacrificial gate electrodes 106B so as to at least partially define, respectively, first and second replacement gate (RMG) cavities 115A, 115B for, respectively, the first and second transistor devices 101A, 101B, and removing the second sacrificial gate insulation layer from the second RMG cavity 115B while leaving the first sacrificial gate insulation layer in position in the first RMG cavity 115A. In this example, the method also includes performing a conformal deposition process to form a conformal gate insulation layer 117 in both the first (115A) and second (115B) RMG cavities, performing at least one process operation to remove the conformal gate insulation layer 117 and the first sacrificial gate insulation layer from the first RMG cavity 115A while leaving the conformal gate insulation layer 117 in position in the second RMG cavity 115B, and performing an oxidation process to form an interfacial gate insulation layer 121 only in the first RMG cavity 115A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A method of forming first and second replacement gate structures for, respectively, first and second transistor devices that are formed above a semiconductor substrate, the method comprising:
    forming first and second sacrificial gate structures for, respectively, the first and second transistor devices, the first and second sacrificial gate structures comprising, respectively, first and second sacrificial gate insulation layers and, respectively, first and second sacrificial gate electrodes;
    removing the first and second sacrificial gate electrodes so as to at least partially define, respectively, first and second replacement gate (RMG) cavities for, respectively, the first and second transistor devices;
    removing the second sacrificial gate insulation layer from the second RMG cavity while leaving the first sacrificial gate insulation layer in position in the first RMG cavity;
    performing a conformal deposition process to form a conformal gate insulation layer in both the first and second RMG cavities;
    performing at least one process operation to remove the conformal gate insulation layer and the first sacrificial gate insulation layer from the first RMG cavity while leaving the conformal gate insulation layer in position in the second RMG cavity; and
    performing an oxidation process to form an interfacial gate insulation layer only in the first RMG cavity.

2. The method of claim 1, wherein the first and second transistor devices are FINFET transistor devices, the semiconductor substrate is a bulk silicon substrate, the first and second sacrificial gate insulation layers comprise silicon dioxide and the first and second sacrificial gate electrodes comprise one of polysilicon or amorphous silicon.

3. The method of claim 1, wherein, prior to removing the second sacrificial gate insulation layer from the second RMG cavity, the method comprises forming a first patterned etch mask that covers the first transistor device and exposes the second transistor device for further processing.

4. The method of claim 3, wherein, prior to performing the conformal deposition process to form the conformal gate insulation layer, the method comprises removing the first patterned etch mask.

5. The method of claim 4, wherein, prior to performing the at least one process operation to remove the conformal gate insulation layer and the first sacrificial gate insulation layer from the first RMG cavity, the method further comprises forming a second patterned etch mask that covers the second transistor device and exposes the first transistor device for further processing.

6. The method of claim 5, wherein, prior to performing the oxidation process to form the interfacial gate insulation layer only in the first RMG cavity, the method comprises removing the second patterned etch mask.

7. The method of claim 1, wherein removing the second sacrificial gate insulation layer from the second RMG cavity exposes a surface of the semiconductor substrate within the second RMG cavity.

8. The method of claim 1, wherein performing the at least one process operation to remove the conformal gate insulation layer and the first sacrificial gate insulation layer from the first RMG cavity exposes a surface of the semiconductor substrate within the first RMG cavity.

9. The method of claim 1, wherein performing the at least one process operation to remove the conformal gate insulation layer and the first sacrificial gate insulation layer from the first RMG cavity exposes a surface of the semiconductor substrate within the first RMG cavity.

10. The method of claim 9, wherein performing the oxidation process forms the interfacial gate insulation layer on the exposed surface of the semiconductor substrate within the first RMG cavity.

11. The method of claim 1, wherein the first transistor device has a first channel length and the second transistor device has a second channel length, wherein the first channel length is less than the second channel length.

12. The method of claim 1, further comprising forming additional materials for the first replacement gate structure within the first RMG cavity above the interfacial gate insulation layer.

13. The method of claim 1, further comprising forming additional materials for the second replacement gate structure within the second RMG cavity above the conformal gate insulation layer.

14. The method of claim 1, further comprising forming a high-k gate insulation layer on and in contact with the interfacial gate insulation layer within the first RMG cavity.

15. The method of claim 1, further comprising forming a high-k gate insulation layer on and in contact with the conformal gate insulation layer within the second RMG cavity.

16. A method of forming first and second replacement gate structures for, respectively, first and second transistor devices that are formed above a semiconductor substrate, the method comprising:
- forming first and second sacrificial gate structures for, respectively, the first and second transistor devices, the first and second sacrificial gate structures comprising, respectively, first and second sacrificial gate insulation layers and, respectively, first and second sacrificial gate electrodes;
- removing the first and second sacrificial gate electrodes so as to at least partially define, respectively, first and second replacement gate (RMG) cavities for, respectively, the first and second transistor devices;
- removing the second sacrificial gate insulation layer from the second RMG cavity while leaving the first sacrificial gate insulation layer in position in the first RMG cavity, the removal of the second sacrificial gate insulation layer from the second RMG cavity exposing a surface of the semiconductor substrate within the second RMG cavity;
- performing a conformal deposition process to form a conformal gate insulation layer in both the first and second RMG cavities, the conformal gate insulation layer being formed on and in contact with the first sacrificial gate insulation layer within the first RMG cavity and on and in contact with the exposed surface of the semiconductor substrate within the second RMG cavity;
- performing at least one process operation to remove the conformal gate insulation layer and the first sacrificial gate insulation layer from the first RMG cavity while leaving the conformal gate insulation layer in position in the second RMG cavity, the removal of the first sacrificial gate insulation layer from the first RMG cavity exposing a surface of the semiconductor substrate within the first RMG cavity; and
- performing an oxidation process to form an interfacial gate insulation layer only in the first RMG cavity, the interfacial gate insulation layer being formed on and in contact with the exposed surface of the semiconductor substrate within the first RMG cavity.

17. The method of claim 16, further comprising forming additional materials for the first replacement gate structure within the first RMG cavity above the interfacial gate insulation layer.

18. The method of claim 16, further comprising forming additional materials for the second replacement gate structure within the second RMG cavity above the conformal gate insulation layer.

19. The method of claim 16, wherein the first transistor device has a channel length that is less than 18 nm and the second transistor device has a channel length that falls within a range of 18-30 nm.

* * * * *